United States Patent
Wick et al.

(10) Patent No.: US 11,693,061 B2
(45) Date of Patent: Jul. 4, 2023

(54) DEVICE FOR MONITORING BATTERY CELLS OF A BATTERY STRING IN LOAD OPERATION

(71) Applicant: VOLKSWAGEN AKTIENGESELLSCHAFT, Wolfsburg (DE)

(72) Inventors: Christian Wick, Cremlingen (DE); Sascha Beaury, Gifhorn (DE); Stephan Gloger, Berlin (DE); Martin Heuser, Bochum (DE); Jens Bandener, Bochum (DE); Philipp Scheer, Haan (DE)

(73) Assignee: Volkswagen Aktiengesellschaft

( * ) Notice: Subject to any disclaimer, the term of this patent is extended or adjusted under 35 U.S.C. 154(b) by 0 days.

(21) Appl. No.: 17/519,918

(22) Filed: Nov. 5, 2021

(65) Prior Publication Data
US 2022/0170996 A1 Jun. 2, 2022

(30) Foreign Application Priority Data
Dec. 2, 2020 (DE) ..................... 10 2020 215 244.6

(51) Int. Cl.
*G01R 31/00* (2006.01)
*G01R 31/396* (2019.01)
*G01R 31/382* (2019.01)
*H02J 7/00* (2006.01)

(52) U.S. Cl.
CPC ......... *G01R 31/396* (2019.01); *G01R 31/382* (2019.01); *H02J 7/0013* (2013.01); *H02J 7/0047* (2013.01)

(58) Field of Classification Search
USPC .......................................... 324/426, 432–435
See application file for complete search history.

(56) References Cited

U.S. PATENT DOCUMENTS

| | | | | |
|---|---|---|---|---|
| 5,231,990 | A * | 8/1993 | Gauglitz | A61B 5/30 600/512 |
| 2012/0013195 | A1* | 1/2012 | Chang | H02J 7/32 307/82 |
| 2012/0306504 | A1* | 12/2012 | van Lammeren | G01R 31/396 324/426 |
| 2013/0185007 | A1 | 7/2013 | Imre et al. | |
| 2015/0153415 | A1 | 6/2015 | Fink | |
| 2015/0222133 | A1 | 8/2015 | Milios | |

FOREIGN PATENT DOCUMENTS

| | | |
|---|---|---|
| DE | 1020182216518 A1 | 3/2020 |
| WO | 0235677 A1 | 5/2002 |

* cited by examiner

*Primary Examiner* — Vincent Q Nguyen
(74) *Attorney, Agent, or Firm* — Barnes & Thornburg, LLP

(57) ABSTRACT

A device for monitoring battery cells of a battery string under load condition. The device has differential voltage units for each battery cell, wherein a band-pass filter is arranged downstream of each differential voltage unit, wherein the band-pass filters are connected to rectifier circuits with a smoothing circuit arranged downstream, and wherein the device is designed so the output signals of the smoothing circuits are supplied to an evaluation unit and are compared for deviations in relation to a standardized output signal.

10 Claims, 1 Drawing Sheet

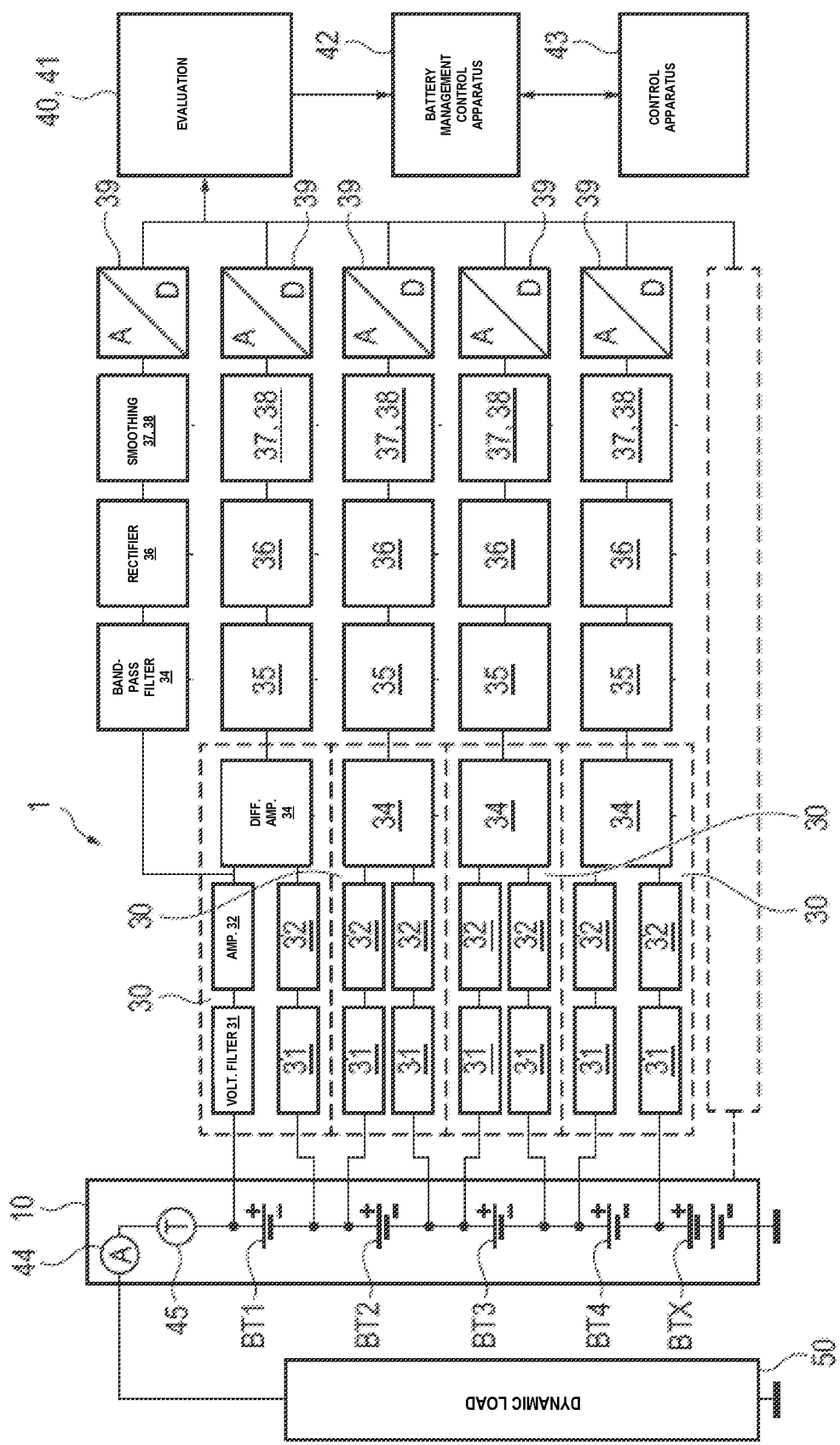

DEVICE FOR MONITORING BATTERY CELLS OF A BATTERY STRING IN LOAD OPERATION

PRIORITY CLAIM

This patent application claims priority to German Patent Application No. 10 2020 215 244.6, filed 2 Dec. 2020, the disclosure of which is incorporated herein by reference in its entirety.

SUMMARY

Illustrative embodiments relate to a device for monitoring battery cells of a battery string during operation under load.

BRIEF DESCRIPTION OF THE DRAWINGS

Disclosed embodiments will be described in more detail below with reference to the drawing, in which:

FIG. 1 shows a schematic block circuit diagram of a device for monitoring battery cells of a battery string under load condition.

DETAILED DESCRIPTION

Thermal propagation (thermal runaway) may occur in the case of undetected damage to a battery cell in a battery string, for example, as a result of a manufacturing fault, impermissible heating or other damage. For reasons of safety, efforts are made to detect this occurrence as early as possible. The sensor systems which are known have various drawbacks in this case.

For example, gas or pressure sensor systems are known by methods or mechanisms of which it is detected whether a battery cell is outgassing. This is a relatively short time before possible thermal propagation, such that the response time is reduced accordingly. Classical cell voltage measurements are also relatively inert. Direct measurements of the temperatures over all battery cells are very complex in terms of circuitry. One further possible method is the impedance spectroscopy which carries out current and voltage measurements and from this determines the impedance with amplitude and phase in a frequency-dependent manner. Measurement cycles of this type take several minutes and consume a lot of energy.

A method for determining a battery condition of at least one battery cell is known from DE 10 2018 216 518 A1, wherein a current excitation signal is applied, an impedance spectrum of the battery cell is received and an evaluation variable is ascertained by the impedance spectrum. In this case, the current excitation signal consists of at least two periodic signals with frequencies which are different from one another. In this case, the current excitation signal is applied in such a way that it is free of mean values over at least one period of the smallest contained frequency, wherein a first response measurement signal of the battery cell is ascertained and evaluated. Furthermore, at least one of the parameters of amplitude, frequency and relative phase position of at least one component of the current excitation signal is changed depending on the first response measurement signal, such that a measuring error is minimized. Furthermore, a further response measurement signal is ascertained and evaluated, wherein the evaluated value is used as an evaluation variable and that the determination of the battery condition variable of the battery cell takes place by a comparison of at least one diagnostic variable with at least one reference value and/or with at least one further diagnostic variable.

One drawback of this method is that a special measurement window is required for this purpose during operation of the battery string, which reduces the availability.

The disclosed embodiments create a device for monitoring battery cells of a battery string during operation under load, wherein the availability is not limited.

For this purpose, the device for monitoring battery cells of a battery string under load condition comprises differential voltage units for each battery cell of the battery string. In this case, the battery string is a series connection of battery cells. The battery string can be a battery module or a complete battery in this case, for example, a high-voltage battery of an electric or hybrid transportation vehicle which has a battery current flowing through it. In this case, differential voltage measurements are taken at the two battery terminals of a battery cell by the differential voltage units. A band-pass filter is allocated to the differential voltage units in each case, to limit the frequency range to a particularly meaningful frequency band. In this case, the frequency band depends on the battery cell type and the excitation currents which are available in the system/transportation vehicle, wherein results of impedance spectroscopy measurements on the battery cell types can be used in this case, for example.

The band-pass filters are then connected to rectifier circuits, optionally two-way rectifiers, to which a smoothing circuit is connected. A unipolar voltage signal is generated by the rectifier circuits, wherein the smoothing circuit filters out short-term voltage changes. Furthermore, the device is designed in such a way that the output signals of the smoothing circuits are supplied to an evaluation unit and are compared for deviations in relation to a standardized output signal. The battery cells can therefore be continuously monitored during operation under load, without causing operation restrictions. The evaluation is very robust and not very complex, since, in contrast to classical impedance spectroscopy, there are no phase determinations and a separate excitation circuit is not required. The device can be implemented in a very simple manner in hardwired hardware, at least the part of the device in front of the evaluation unit. However, the device can also be implemented by software.

In at least one disclosed embodiment, the evaluation unit is designed as a microprocessor and analog-to-digital converters are arranged between the smoothing circuits and the microprocessor, to prepare the analog voltage signals for the microprocessor.

In at least one further disclosed embodiment, the smoothing circuits are designed as low-pass filters. This also simplifies the analog-to-digital conversion, such that the requirements for the analog-to-digital converter are reduced.

In at least one disclosed embodiment, the standardized output signal is the band-pass-filtered voltage response of a selected battery cell or a battery terminal of a selected battery cell. Alternatively, the standardized output signal can also be formed in the evaluation unit as a mean value over all output voltage signals of the battery cells (e.g., arithmetic mean values).

Alternatively or additionally, the device can have a current sensor which detects the current through the battery string, wherein the standardized output signal is ascertained by the current of the battery string. It is clear that in the case of larger current loads, the voltage changes at the battery cells also become greater in amplitude.

In at least one further disclosed embodiment, a differential voltage unit has two DC voltage filters, which are allocated to a battery terminal in each case, and a differential amplifier. The DC voltage filters can also be referred to as DC blockers and in the simplest case are designed as capacitors, similar to a capacitive galvanic isolation. Separating the DC voltage components significantly simplifies the subsequent signal processing, since all signals can then be measured against the same reference mass.

In at least one further disclosed embodiment, an amplifier is arranged between a DC voltage filter and an input of the differential amplifier in each case. The amplifier is primarily used in this case for amplifying the voltage signals but additionally filters out high-frequency components owing to its inertia, which is beneficial for the subsequent differential amplifier and band-pass filter.

In at least one further disclosed embodiment, the lower cutoff frequency of the band-pass filter is greater than/equal to 50 Hz and the upper cutoff frequency is less than/equal to 500 Hz, further optionally the band pass is at 100 Hz lower cutoff frequency and 300 Hz upper cutoff frequency.

In at least one further disclosed embodiment, a temperature sensor is allocated to at least one battery cell, wherein the device is designed to estimate the temperatures of the battery cells without a temperature sensor based on the measurement results of the differential voltage units and the measurement value of the temperature sensor.

In at least one further disclosed embodiment, the device is part of a traction network of an electric or hybrid transportation vehicle.

The disclosure is explained in greater detail hereinafter using an exemplary embodiment.

FIG. 1 represents a block circuit diagram of a device 1 for monitoring a battery string 10 with a plurality of battery cells BT1-BTX. In this case, the implementation of the device 1 in terms of circuitry is represented for the first four battery cells BT1-BT4, wherein the continuation for the further battery cells BTX is merely indicated with dashed lines. The device 1 has differential voltage units 30 corresponding to the number of battery cells BT1-BTX. Each differential voltage unit 30 has two DC voltage filters 31, which are connected to a battery terminal of the allocated battery cell BT1-BTX in each case. The outputs of the DC voltage filters 31 are connected to an input of an amplifier 32 in each case, wherein the two outputs of the amplifier 32 are connected to the inputs of a differential amplifier 34. Furthermore, the device 1 has band-pass filters 35, wherein the outputs of the differential amplifiers 34 are connected to an input of a band-pass filter 35 in each case, which has a lower cutoff frequency of 100 Hz and an upper cutoff frequency of 300 Hz, for example. The outputs of the band-pass filters 35 are connected to rectifier circuits 36, to which low-pass filters 38 are connected as smoothing circuits 37. The outputs of the low-pass filters 38 are connected to analog-to-digital converters 39, the outputs of which are, in turn, connected to an evaluation unit 40. such as a microprocessor 41 or control apparatus. In addition, a circuit branch is present with a band-pass filter 35, a rectifier circuit 36, a low-pass filter 38 and an analog-to-digital converter 39 for the voltage signal at the upper battery terminal of the first battery cell BT1, wherein the signal at the output of the amplifier 32 is guided to the band pass 35. The evaluation unit 40 is connected to a battery management control apparatus 42, for example, which, in turn, is connected to further control apparatuses 43. Finally, a dynamic load 50 is connected to the battery string 10, such as an inverter of a traction network of an electric transportation vehicle, for example. In this case, the device 1 can further have a current sensor 44 and a temperature sensor 45 can be allocated to at least one battery cell BT1-BTX.

The mode of operation of the device 1 shall now be explained briefly. The battery string 10 is charged by the dynamic load 50, such that a corresponding dynamic load current flows through the battery string 10 or rather the battery cells BT1-BTX. This load current causes voltage changes at the battery cells BT1-BTX. These differential voltage changes at the battery terminals are ideally all of equal size, i.e., all battery cells have the same load. The DC voltage components are now blocked by the DC voltage filters 31 and only the AC voltage components are allowed to pass through for further processing, wherein very high-frequency components are filtered out by the amplifier 32 or the differential amplifier. The AC voltage of the individual battery cells BT1-BTX is then present at the outputs of the differential amplifiers 34 as a voltage response to the load current. The frequency band of the voltage response is then limited to a meaningful range by the band-pass filter 35. These signals at the output of the band-pass filters 35 are also ideally the same for all battery cells BT1-BTX. The signals of the band-pass filters 35 are then converted into unipolar voltage signals by the rectifier circuits 36 and are subsequently smoothed by the low-pass filters 38. These signals are then digitized and are compared in the evaluation unit 40. Ideally, all signals behave the same way. However, if a battery cell BT1-BTX is defective or overheated, its voltage response deviates from the other voltage responses. Certain deviations always occur, owing to the fact that in reality the battery cells BT1-BTX are never all completely identical. To now estimate more effectively whether a deviation lies within the tolerance range or if it is to be attributed to a defect, a standardized output signal is used, for example, the voltage change at a selected battery terminal of a battery cell or the voltage change over a selected battery cell. Alternatively or additionally, a mean value is formed in the evaluation unit 40. If one or a plurality of battery cells or rather their voltage responses now deviates from the standardized voltage response, a defect (e.g., mechanical damage or overheating) can be inferred and corresponding countermeasures can be initiated and/or a warning signal can be generated. For example, the load current can be reduced and/or a cooling power for the battery cells can be increased.

A situation which could lead to thermal propagation can therefore be detected at a very early stage by the device 1, wherein the device does not give rise to any restriction of operation and it does not require a separate excitation circuit.

LIST OF REFERENCE NUMBERS 1 device
10 battery string
30 differential voltage unit
31 DC voltage filter
32 amplifier
34 differential amplifier
35 band-pass filter
36 rectifier circuit
37 smoothing circuit
38 low-pass filter
39 analog-to-digital converter
40 evaluation unit
41 microprocessor
42 battery management control apparatus
43 further control apparatus
44 current sensor
45 temperature sensor
50 dynamic load
BT1-BTX battery cells

The invention claimed is:

1. A device for monitoring battery cells of a battery string under load condition, the device comprising:
   differential voltage units for each battery cell;
   a band-pass filter allocated downstream of each differential voltage unit;
   a plurality of rectifier circuits,
   wherein the band-pass filters are connected to the rectifier circuits and are connected to smoothing circuits; and
   an evaluation unit, wherein outputs signals of the smoothing circuits are supplied to the evaluation unit that compares the output signals for deviations relative to a standardized output signal.

2. The device of claim 1, wherein the evaluation unit is a microprocessor and analog-to-digital converters are arranged between the smoothing circuits and the microprocessor.

3. The device of claim 1, wherein the smoothing circuits are low-pass filters.

4. The device of claim 1, wherein the standardized output signal is a band-pass-filtered voltage response of a selected battery cell or a mean value over all output signals of the battery cells.

5. The device of claim 1, further comprising a current sensor for the battery string, wherein the device ascertains the standardized output signal by the current of the battery string.

6. The device of claim 1, wherein each of the differential voltage units has two DC voltage filters, which are allocated to a battery cell terminal of a battery cell, and a differential amplifier.

7. The device of claim 6, wherein an amplifier is arranged between a DC voltage filter and an input of the differential amplifier in each case.

8. The device of claim 1, wherein the lower cutoff frequency of the band-pass filter is greater than 50 Hz and the upper cutoff frequency is less than 500 Hz.

9. The device of claim 1, wherein a temperature sensor is allocated to at least one battery cell, wherein the device estimates the temperatures of the battery cells without temperature sensors based on the output signals.

10. The device of claim 1, wherein the device is part of a traction network of an electric or hybrid transportation vehicle.

* * * * *